United States Patent
Friedlander et al.

[19]

[11] Patent Number: 5,892,342
[45] Date of Patent: Apr. 6, 1999

[54] SELF-TEST CIRCUIT FOR A SHORTED DIODE PROTECTION PANEL IN A DIESEL ELECTRIC LOCOMOTIVE

[75] Inventors: Ariel Friedlander, Mequon, Wis.; Bret Dwayne Worden, Union City, Pa.; Myron Lee Smith, Fairview, Pa.; Charles Earl Cooper, Erie, Pa.

[73] Assignee: General Electric Company, Erie, Pa.

[21] Appl. No.: 845,126

[22] Filed: Apr. 21, 1997

[51] Int. Cl.[6] .................................. H02H 7/06; H02P 9/00
[52] U.S. Cl. .......................... 318/434; 318/254; 318/439; 318/139; 361/21
[58] Field of Search ...................... 318/140–149, 318/139; 307/9, 10–12, 64, 66; 361/20–24, 30, 18; 322/37, 59, 69, 99, 61, 28; 324/537, 500, 527, 133; 320/48, 64

[56] References Cited

U.S. PATENT DOCUMENTS

| | | | |
|---|---|---|---|
| 4,000,453 | 12/1976 | Sheldrake et al. | 322/99 |
| 4,019,120 | 4/1977 | Fattic | 322/28 |
| 4,032,828 | 6/1977 | Strobl et al. | 320/39 |
| 4,041,369 | 8/1977 | King et al. | 322/99 |
| 4,243,927 | 1/1981 | D'Atre . | |
| 4,486,801 | 12/1984 | Jackovich et al. | 361/21 |
| 5,325,062 | 6/1994 | Bachand et al. | 324/537 |
| 5,508,601 | 4/1996 | Good et al. | 322/37 |
| 5,528,444 | 6/1996 | Cooke et al. | 361/20 |
| 5,528,445 | 6/1996 | Cooke et al. | 361/20 |

OTHER PUBLICATIONS

GE docket No. 20–TR–1844, AK Kumar, filed concurrently herewith and claiming benefit of 60,016,629, filed May, 1, 1996.

*Primary Examiner*—Paul Ip
*Attorney, Agent, or Firm*—Jill M. Breedlove; Douglas E. Stoner

[57] ABSTRACT

A self-test system for a shorted diode protection circuit in an electric vehicle propulsion system includes a series of relays for selectively coupling a battery in circuit with a field winding of a generator, the shorted diode protection circuit being coupled in voltage sensing arrangement with the field winding. The relays are operated to induce current in forward and reverse directions through the winding in separate test stages. At each stage the winding is disconnected from the battery so that inductive reactance creates a voltage on the winding to actuate the protection circuit. A system controller records whether the protection circuit is responsive and therefore operable and alerts a vehicle operator.

10 Claims, 2 Drawing Sheets

SELF-TEST CIRCUIT FOR A SHORTED DIODE PROTECTION PANEL IN A DIESEL ELECTRIC LOCOMOTIVE

BACKGROUND OF THE INVENTION

This invention relates generally to electrical propulsion systems for diesel electric traction vehicles such as locomotives and, more particularly, to a self-test circuit for determining the operability of a shorted diode protection circuit in such a system.

In a conventional diesel electric traction vehicle such as a locomotive, a diesel engine is used to drive a synchronous generator that supplies electric current to a plurality of electric traction motors whose rotors are drivingly coupled to the respective wheel axle sets of a locomotive. The generator is typically a three-phase traction alternator having a rotor mechanically coupled to the output shaft of the diesel engine. When excitation current is supplied to field windings of the generator, alternating voltages are generated in the three-phase armature windings. These voltages are coupled to a full-wave bridge rectifier and converted to direct current power on a DC link. In a traction vehicle in which the electric motors are alternating current (AC) motors, the voltage on the DC link is applied to a plurality of inverters which convert the DC voltage to controlled frequency AC voltage for application to the motors.

An on-board control system controls operation of the diesel engine, synchronous generator and inverter in such a manner as to regulate the power applied to the traction motors so as to provide a desired amount of power at the wheels of the traction vehicles to attain a desired speed. In most systems, the diesel engine is operated at a constant speed and the power supplied by the synchronous generator is regulated by varying the field current. Variations in the field current at constant speed will control the magnitude of voltage produced at the armature windings. During normal running conditions, the current being generated by the synchronous generator may be several thousand amperes. If the rectifier circuit connected to the armature windings were to fail to a short circuit condition under such high currents, the amplitude of the armature current will tend to increase abruptly to a much higher peak than normal and then to decay with time. Such initial high current conditions may severely damage the generator and prevent operation of the traction vehicle. For that reason, such vehicles typically include a shorted diode protection circuit connected in circuit with the field winding of the generator for detecting the occurrence of a short circuit condition. The sudden high current condition in the armature windings will produce a magnetomotive force that almost directly opposes the generator field magnetomotive force thereby tending to de-magnetize or weaken the magnetic field in the stator rotor air gap of the generator. This de-magnetizing magnetomotive force induces extra current in a field winding so that the total flux linkages will remain constant. This extra current will create a reflected voltage on the field winding that can be detected by the shorted diode protection circuit. The shorted diode protection circuit immediately transmits a signal to the system controller to effect a rapid removal of excitation current to the field winding so as to cause the generator power to be rapidly reduced. The effect of the shorted diode protection circuit is to reduce the output current of the generator before the maximum available short circuit current is realized.

In known systems, there has been no convenient method for determining whether or not the shorted diode protection circuit in such a traction vehicle is actually operative, although the circuit can be checked out in a repair facility by either removing the protection circuit from the locomotive or by coupling external power sources to the protection circuit. Accordingly, it would be advantageous to provide a system which could routinely test the operability of the shorted diode protection circuit and advise a locomotive operator whether or not it is safe to operate the locomotive.

SUMMARY OF THE INVENTION

The present invention addresses the disadvantages of the prior art described above by providing a method and apparatus for self-test of a shorted diode protection circuit in a diesel electric traction vehicle. In an illustrative embodiment, the method and apparatus is illustrated in combination with a conventional diesel electric locomotive including a synchronous generator supplying power to a plurality of alternating current electric traction motors coupled in driving relationship to wheels of the vehicle. The generator output is applied to a full wave bridge rectifier for developing a DC output voltage which is then coupled to a plurality of inverters supplying alternating current power to each of the traction motors. A DC link capacitor is connected across the rectifier output along with a dynamic brake resistor grid and dynamic brake contactor for selectively connecting the dynamic brake resistor grid across the DC link when the locomotive is operated in a dynamic brake mode. The generator circuit includes a shorted diode protection circuit connected in parallel with the field winding of the generator. The self-test circuit is illustrated as a plurality of switches for selectively coupling the generator field winding to a battery of the traction vehicle when the generator is not being operated, i.e., the generator rotor is not turning and no power is being applied to the generator field winding. In the method of the present invention, the switches connect the locomotive battery to the generator field winding through the DC link capacitor and allows current to build in the field winding until the voltage on the link capacitor reaches the voltage of the battery. At this time, a switch is opened to force the current established in the generator field winding to free wheel. The only path of the free wheel current is through the shorted diode protection circuit thereby causing the shorted diode protection circuit to be tripped if it is operational. Tripping of the shorted diode protection circuit is detected and a signal provided to indicate that the protection circuit is operable for voltage of a first polarity on the field winding. Subsequently, the dynamic brake resistor grid is connected in parallel with the DC link capacitor to thereby discharge the capacitor and the dynamic brake switch is then opened to again isolate the capacitor after it is discharged. A switch is then thrown to couple the battery back into circuit with the series combination of the link capacitor and field winding and the connection maintained until the resonant reaction of the series LC circuit causes the voltage on the field winding to reverse. At a peak reversal value, the battery is disconnected again causing the current in the field winding to free wheel through the shorted diode protection circuit. However, because the voltage on the field winding was reversed, the current is in a reverse direction. This allows checking of the reverse polarity detection function of the shorted diode protection circuit. The on-board controller will receive signals from the shorted diode protection panel indicating the occurrence of a fault condition and can therefore verify that the self-test of the circuit is satisfactory. Preferably, the switches used to connect the battery into circuit with the capacitor and generator field winding are controlled by timers to avoid the need to actually monitor voltage and current on the field winding or link capacitor.

BRIEF DESCRIPTION OF THE DRAWINGS

For a better understanding of the present invention, reference may be had to the following detailed description taken in conjunction with the accompanying drawings in which.

DETAILED DESCRIPTION OF THE INVENTION

Figure 1:
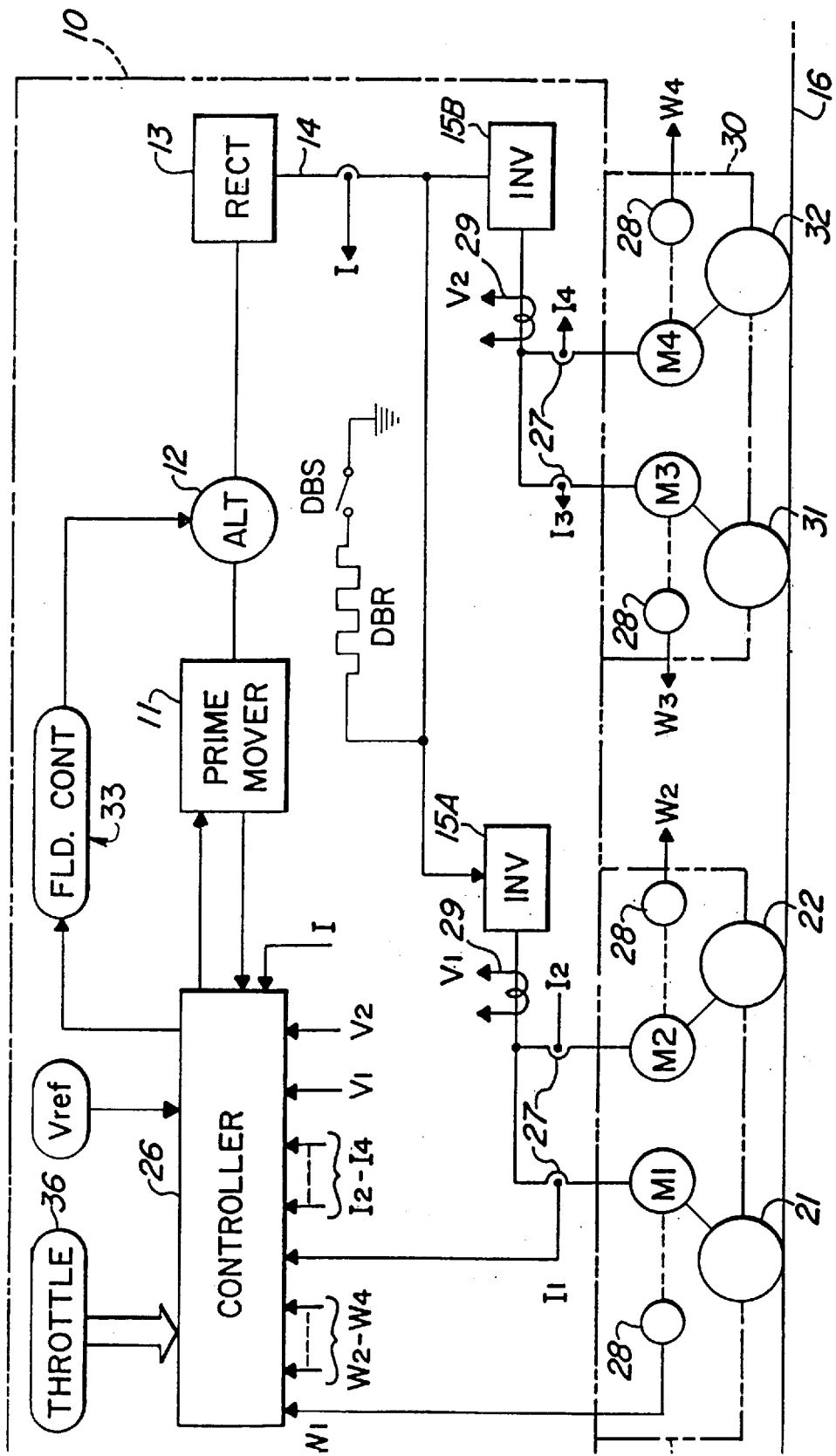
FIG. 1 is a simplified block diagram of the principal components of a propulsion system for a diesel-electric locomotive with which the present invention may be used.

The present invention may be utilized in various types of alternating current (AC) induction motor powered vehicles such as, for example, off-highway vehicles (earth moving machines), transit cars and locomotives. For purpose of illustration, the invention is described herein as it may be applied to a locomotive. The propulsion system 10 of FIG. 1 includes a variable speed prime mover 11 mechanically coupled to a rotor of a dynamo electric machine 12 comprising a 3-phase alternating current (AC) synchronous generator or alternator. The 3-phase voltages developed by alternator 12 are applied to AC input terminals of a conventional power rectifier bridge 13. The direct current (DC) output of bridge 13 is coupled via DC link 14 to a pair of controlled inverters 15A and 15B which inverts the DC power to AC power at a selectable variable frequency. The AC power is electrically coupled in energizing relationship to each of a plurality of adjustable speed AC traction motors M1 through M4. Prime mover 11, alternator 12, rectifier bridge 13 and inverters 15A, 15B are mounted on a platform of the traction vehicle 10, illustrated as a 4-axle diesel-electric locomotive. The platform is in turn supported on two trucks 20 and 30, the first truck having two axle-wheel sets 21 and 22 and the second truck 30 having two axle-wheel sets 31 and 32.

Each of the traction motors M1–M4 is hung on a separate axle and its rotor is mechanically coupled, via conventional gearing, in driving relationship to the associated axle-wheel set. In the illustrative embodiment, the two motors M1 and M2 are electrically coupled in parallel with one another and receive power from inverter 15A while motors M3 and M4 are coupled to inverter 15B. However, in some instances, it may be desirable to provide an inverter for each motor or to couple additional motors to a single inverter. Suitable current transducers 27 and voltage transducers 29 are used to provide a family of current and voltage feedback signals, respectively, representative of the magnitudes of current and voltage in the motor tators. Speed sensors 28 are used to provide speed signals representative of the rotational speeds W1–W4 in revolutions per minute (RPM) of the motor shafts. These speed signals are readily converted to wheel speed in a well known manner. For simplicity, only single lines have been indicated for power flow although it will be apparent that the motors M1–M4 are typically three phase motors so that each power line represents three lines in such applications.

The magnitude of output voltage and current supplied to rectifier bridge 13 is determined by the magnitude of excitation current supplied to the field windings of the alternator 12 by field controller 33 which may be a conventional phase controlled rectifier circuit since the alternator field requires DC excitation. The excitation current is set in response to an operator demand (Throttle 36) for vehicle speed by the controller 26 which is in turn responsive to actual speed as represented by signals W1–W4. The controller 26 converts the speed command to a corresponding torque request for use in controlling the motors M1–M4. Since AC motor torque is proportional to rotor current and air gap flux, these quantities may be monitored or, more commonly, other quantities such as applied voltage, stator current and motor RPM may be used to reconstruct motor torque in controller 26. See, for example, U.S. Pat. No. 4,243,927.

In an electrical braking or retarding mode of operation, inertia of the moving vehicle is converted into electrical energy by utilizing the traction motors as generators. Motor voltage and current are controlled to set a desired braking effort. The generated power from the motors is coupled in a reverse direction through the inverters to the DC link 14. In a dynamic braking mode of operation, this power is dissipated in dynamic braking resistor grid DBR which is coupled across the DC link by a dynamic brake contactor DBS.

Figure 2:
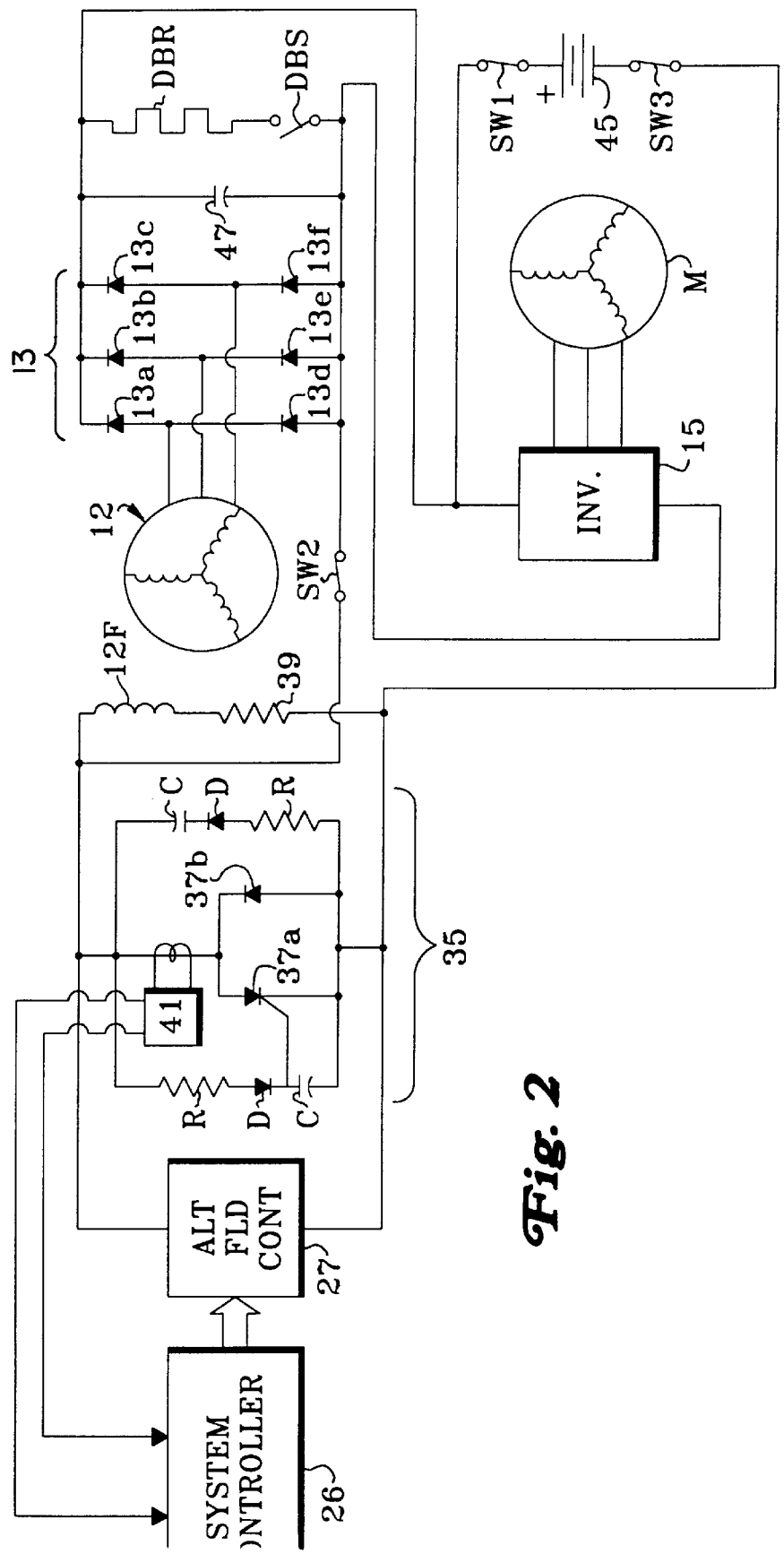
FIG. 2 is a simplified schematic representation of a self-test system suggested by the present invention.

Turning now to FIG. 2, there is shown a more detailed illustration of the power rectifier circuit 13 connected to the output of the alternator 12 along with an illustration of an exemplary shorted diode protection circuit 35 connected in parallel circuit arrangement with a winding 12F of alternator 12. The purpose of the shorted diode protection circuit 35 is to provide a means for rapidly limiting excess voltage on field winding 12F in the event of a short circuit condition on the output windings of the alternator such as might be caused by short circuiting of one of the diodes 13A–13F in rectifier circuit 13. The purpose of short circuiting the alternator field winding 12F will be better understood from the following explanation of the alternator's response to a short circuit condition.

The alternator 12 in a diesel electric locomotive system is a high reactance, salient pole synchronous machine without damping or amortisseur windings. If the load circuit connected to the output terminals of the armature windings of this machine are short circuited, the amplitude of armature current will tend to increase abruptly to a peak much higher than normal and then to decay with time. The initial current increase in the armature windings produces a magnetomotive force (MMF) that almost directly opposes the field MMF, thereby tending to demagnetize or weaken the magnetic field in the stator-rotor air gap of the alternator. The demagnetizing MMF induces extra current in the field winding so that the total flux linkages will remain constant. In general, the system control and alternator field control respond to the resulting change in output voltage at the alternator output terminals but the response time of these devices is too slow to prevent the field current increase. So long as the excitation current provided by alternator field control 27 remains constant, the initial peak magnitude short circuit current is determined by the transient reactance of the alternator and the reactance in the current path connected to the alternator output windings. The time constant of the current decay is determined by the electrical inductance and resistance in the excitation current path.

As soon as the protection circuit 35 senses the short circuit condition due to the reflected voltage on the field winding 12 and effects a short circuit across the terminals of the field winding, the effective resistance in parallel with winding 12F is significantly reduced and the time constant for current decay becomes significantly smaller so that excitation current will very rapidly decay towards zero. In effect, the reactance of the alternator rapidly increases from its initial relatively low transient value to the value of its synchronous reactance, and the armature current magnitude is decreased correspondingly. If the protection circuit works properly to quickly decouple the field 12F from its power source 27, the output current of the alternator 12 will begin to decrease from its initial surge before reaching the maximum available short circuit magnitude. In general, it has been found that a protection circuit such as that shown at 35 can effectively limit the fault current to about 25 percent of what it would be without the protection circuit.

The illustrated protection circuit 35 includes a pair of parallel connected, reversely poled gatable switching devices 37A and 37B. Each of these switching devices may comprise a conventional SCR or other type of well known electronic switchable devices. A gate terminal of each of the devices is connected to a trigger circuit comprising the series combination of a resistor R. diode D and capacitor C. The gate terminal is connected to the junction intermediate the diode D and capacitor C. As is apparent, one trigger circuit is designed to enable the switching device for a positive polarity of voltage on winding 12F and the other trigger circuit is designed to enable the switching device for a negative polarity of voltage on winding 12F. Under normal conditions, the capacitor C will charge to a voltage at a slow rate such that the gate to anode voltage will be insufficient to cause the device to switch into conduction. However, if a short circuit condition exists on the output windings of the alternator 12, the reflected voltage as discussed above will cause a voltage drop to exist across the appropriate one of the resistors R which will cause the associated switching device to be gated into conduction thereby placing a short circuit across the field winding 12F. Note however that there is a small resistor 39 associated with the field winding 12F which will control the decay rate of current in the field winding.

When one of the devices 37A or 37B is gated into conduction, current through one of the devices will be detected by a current sensor 41. The sensor 41 is connected to a common lead between the power supplied to one terminal of the field winding 12F and the switching devices. A signal from the current sensor 41 is supplied to the system controller which can take appropriate action to compensate for the short circuit condition. For example, the controller may limit engine RPM to a minimum value and prohibit operation of the locomotive in all power modes.

From the above discussion, it can be seen that it is desirable to have the protection circuit 35 in order to protect the armature 12 from short circuit conditions. For that reason, it is also desirable to assure that the protection circuit 35 is functional to operate when a short circuit condition exists. The present invention provides a means for testing the status of the protection circuit 35 to assure its operability. In this regard, three switches SW1, SW2 and SW3 are utilized in order to selectively couple the locomotive battery 45 into circuit with the field winding 12F.

A capacitor 47 is generally coupled across the output terminals of the rectifier 13 to provide voltage smoothing both in the propulsion and electrical braking modes of operation of the vehicle. This capacitor is generally referred to as a DC link capacitor. The switch SW1 is connected between a positive terminal of the battery 45 and the positive voltage bus from the rectifier circuit 13. The switch SW3 connects a negative terminal of the battery 45 to one terminal of the protection circuit 35. Note also that this places the switch SW3 in connection to a lower terminal of the field winding 12F in FIG. 2. The switch SW2 connects an upper terminal of the protection circuit 35 and consequently the upper terminal of field winding 12F to the negative voltage bus at the rectifier circuit 13.

For self-test operation, no power is applied to the field winding 12F and the alternator 12 is not producing any output power. Typically, the test would be run before cranking or starting of the locomotive. The alternator field control 27 is disabled also. As a first step in testing, all of the switches SW1, SW2 and SW3 are closed so that the battery acts as a charging circuit to begin charging the line filter capacitor 47 through the field winding 12F. When the line filter voltage reaches battery voltage, the alternator field current will be at a maximum value. At this time, the switch SW1 is opened and the alternating field current will free wheel. Since the only path for the free wheel current is through the resistor and diode forming part of the trigger circuit for the positive side SCR 37b, this free wheel current will cause SCR 37b to be gated into conduction, assuming that the components of the protection circuit are operable. When SCR 37b is gated into conduction, current will be detected by the current sensor 41 which will provide a signal to the system controller 26 to indicate that the positive voltage protection circuit is operable.

The voltage on the line filter capacitor 47 is discharged by closing the switch DBS to couple the dynamic brake resistor grid DBR across the capacitor. The switch DBS is then opened and the switch SW1 is reclosed allowing the line filter voltage to again build up in a positive direction. However, on this cycle, the switch SW1 is maintained closed until the resonant action of the series LC circuit (capacitor 47 and field winding 12F) causes a voltage/current reversal across field winding 12F. The capacitor 47 and winding 12F form an underdamped, series LC resonant circuit having a frequency of $$1/(2\pi\sqrt{LC}).$$

The resultant current in the resonant circuit can be shown to be approximately sinusoidal, increasing to a first positive peak value when capacitor voltage reaches battery voltage and thereafter decreasing and reversing direction until a negative peak value is reached with the oscillations continuing until damped out or switch SW1 is opened. When the current reaches a first maximum in the reverse direction, the switch SW1 is opened. The reversed alternator field current, due to the inductive reactance of winding 12F, will seek a path through circuit 35 and turn on the negative side SCR 37A of the shorted diode protection circuit 35 in the same manner as the SCR 37b was turned on for positive current. The current sensor 41 will again detect current flowing through the circuit 35 and will transmit a signal to the main controller 26. The main controller can utilize the signal occurring during this test mode (forward and reverse current detection) to actuate a visual indicator in the locomotive to indicate either that the protection circuit is operative or non-operative. If the protection circuit is non-operative, the locomotive engineer has the option of attempting to run the locomotive without the protection circuit, preferably at a reduced power level.

The operation of the switches SW1, SW2, SW3, and DBS are controlled by controller 26 using a simple software program. Preferably, the switches are time controlled thus avoiding the need to monitor voltages or currents at the DC link or field winding. In particular, since it is well known that the frequency of the sinusoid created by coupling a battery in series circuit with a capacitor and an inductor is given by the relationship $$f = 1/2\pi \sqrt{LC} \,,$$

given the values of inductance L for winding 12F and the value of capacitance C for link capacitor 47, the time at which the current reaches the first positive peak and the first negative peak are easily computed. The switches can therefore be operated at timed intervals.

After the two modes of tests have been completed on the protection circuit 35, the line filter 47 can be allowed to bleed down to zero or discharged through the dynamic brake resistor grid DBR by actuating switch DBS. Switches SW2 and SW3 are opened at the completion of the test mode so that the phase controller's power circuits may be actuated to allow the locomotive to be started.

While the invention has been described in what is presently considered to be a preferred embodiment, many variations and modifications will become apparent to those skilled in the art. Accordingly, it is intended that the invention not be limited to the specific illustrative embodiment but be interpreted within the full spirit and scope of the appended claims.

What is claimed:

1. A self-test circuit for a shorted diode protection system in a traction vehicle propulsion system, the propulsion system including a synchronous generator having armature and field windings, a controllable source of excitation current connected to the field winding and electric power conditioning means interconnecting the armature windings to at least one electric traction motor, the power conditioning means including a full bridge rectifier circuit for converting alternating current (AC) power from the armature windings to direct current (DC) power on a DC link, a DC link capacitor connected between relatively positive and relatively negative busses of the DC link, the vehicle further including a battery, the protection system including at least one switching device connected in parallel circuit with the field winding and a gating circuit coupled to actuate the switching device in response to a reflected AC voltage on the field winding, the self-test circuit comprising:

first switch means for coupling a positive terminal of the battery to the relatively positive bus of the DC link;
   second switch means for coupling one end of the field winding to the relatively negative bus of the DC link;
   third switch means for coupling another end of the field winding to a negative terminal of the battery;
   means for selectively actuating the first, second and third switch means for establishing a current in the field winding sufficient to actuate the gating circuit for gating the switching device into conduction; and
   means for detecting conduction of the switching device to verify operation of the shorted diode protection system.

2. The self-test circuit of claim 1 wherein the means for selectively actuating the switch means comprises means operable upon selection of a self-test mode for actuating said second and third switch means during a time duration of the self-test mode and timing means for actuating said first switch means in a first test sequence until voltage on the link capacitor reaches about a detecting operation of said shorted diode protection circuit in response to said transferred current.

3. A method for initiating a self-test of a shorted diode protection system in a vehicle propulsion system, the propulsion system including a generator having armature and field windings, a controllable source of excitation current connected to the field winding of the generator and an electric power conditioning system interconnecting the armature windings of the generator to at least one electric traction motor, the power conditioning system including a rectifier circuit for converting alternating current (AC) power from the armature windings of the generator to direct current (DC) power on a DC link, and a DC link capacitor connected between relatively positive and relatively negative buses of the DC link, the vehicle further including a battery and the protection system including at least one switching device connected in parallel circuit with the field winding of the generator with a gating circuit coupled to actuate the switching device in response to a reflected AC voltage on the field winding, the method comprising, with the generator in a non-power producing mode, the steps of:

connecting one end of the field winding of the generator to the negative voltage bus of the DC link;
   connecting another end of the field winding of the generator to a negative voltage terminal of the battery;
   connecting a positive voltage terminal of the battery to the positive DC bus of the DC link for a time period sufficient to charge the DC link capacitor to about battery voltage such that current in the field winding is approximately maximized in a first direction and thereupon disconnecting the battery from the positive DC link bus so as to force the field winding current to transfer to a path through the shorted diode protection system; and
   determining if the shorted diode protection system detects the transferred field winding current.

4. The method of claim 3 and including the step of computing a time period for voltage on the DC link capacitor to increase to about battery voltage and disconnecting the battery from the positive DC link bus upon elapse of the computed time period.

5. The method of claim 3 wherein the propulsion system includes a dynamic brake resistance coupled in series with a dynamic brake contactor for selectively coupling the brake resistance in parallel circuit with the DC link capacitor, the method including the step of coupling the brake resistance in parallel with the DC link capacitor when the battery is disconnected from the positive DC link bus and thereby discharging the DC link capacitor.

6. The method of claim 5 and including the steps of:
   opening the dynamic brake contactor;
   re-connecting the battery positive terminal to the positive bus of the DC link and allowing the DC link capacitor to resonately charge to a first negative voltage;
   disconnecting the battery from the positive bus while the DC link capacitor is negatively charged to force current in the field winding to transfer to the shorted diode protection system; and
   detecting operation of said shorted diode protection circuit in response to the transferred current.

7. The method of claim 6 and including the steps of computing a time interval for voltage on the DC link capacitor to charge to the first negative voltage and disconnecting the battery based on the computed time interval.

8. In an electric propulsion system including a synchronous generator having armature and field windings, a controllable source of excitation current connected to the field winding and electric power conditioning means interconnecting the armature windings to at least one electric traction motor, the power conditioning means including a full bridge rectifier circuit for converting alternating current (AC) power from the armature windings to direct current (DC) power on a DC link, a DC link capacitor connected between relatively positive and relatively negative busses of the DC link, the vehicle further including a battery, a shorted diode protection system comprising at least one switching device connected in parallel circuit with the field winding and a gating circuit coupled to actuate the switching device in response to a reflected AC voltage on the field winding, a method of self-testing the shorted diode protection system comprising the steps of:

coupling the battery in circuit with the field winding to establish a current through the field winding;

disconnecting the battery from the field winding such that the field winding current transfers to the shorted diode protection system; and detecting whether the protection system responds to current from the field winding.

9. The method of claim 8 and including the further step of coupling the battery to the field winding through the link capacitor for a time period sufficient to cause the current through the field winding to reverse direction due to resonance of the field winding and capacitor circuit and thereafter repeating the steps of disconnecting and detecting.

10. The method of claim 9 and including the step of coupling a resistor in parallel with the link capacitor to discharge the capacitor prior to the further step of coupling the battery to the field winding through the capacitor.

* * * * *